United States Patent [19]

Kaneko

[11] Patent Number: 4,610,002
[45] Date of Patent: Sep. 2, 1986

[54] DYNAMIC MEMORY CIRCUIT WITH IMPROVED NOISE-PREVENTION CIRCUIT ARRANGEMENT FOR WORD LINES

[75] Inventor: Shouji Kaneko, Tokyo, Japan

[73] Assignee: NEC Corporation, Tokyo, Japan

[21] Appl. No.: 546,759

[22] Filed: Oct. 28, 1983

[30] Foreign Application Priority Data

Oct. 28, 1982 [JP] Japan ................................ 57-189717

[51] Int. Cl.$^4$ ...................... G11C 11/40; G11C 13/00
[52] U.S. Cl. .................................... 365/206; 365/230
[58] Field of Search ........................ 365/206, 189, 230

[56] References Cited

U.S. PATENT DOCUMENTS 4,409,678 10/1983 Takemae et al. .................... 365/206

Primary Examiner—Terrell W. Fears
Attorney, Agent, or Firm—Sughrue, Mion, Zinn, Macpeak and Seas

[57] ABSTRACT

A memory circuit provided with improved noise-prevention circuit arrangement for word lines is disclosed. The memory circuit is structured in such a manner that each word decoder is provided for each word line group including a plurality of word lines for selecting the associated word line group, and a noise-prevention circuit of a flip flop type is provided for each of the work decoder for preventing an output of the word decoder from floating when that word decoder is not selected.

11 Claims, 4 Drawing Figures

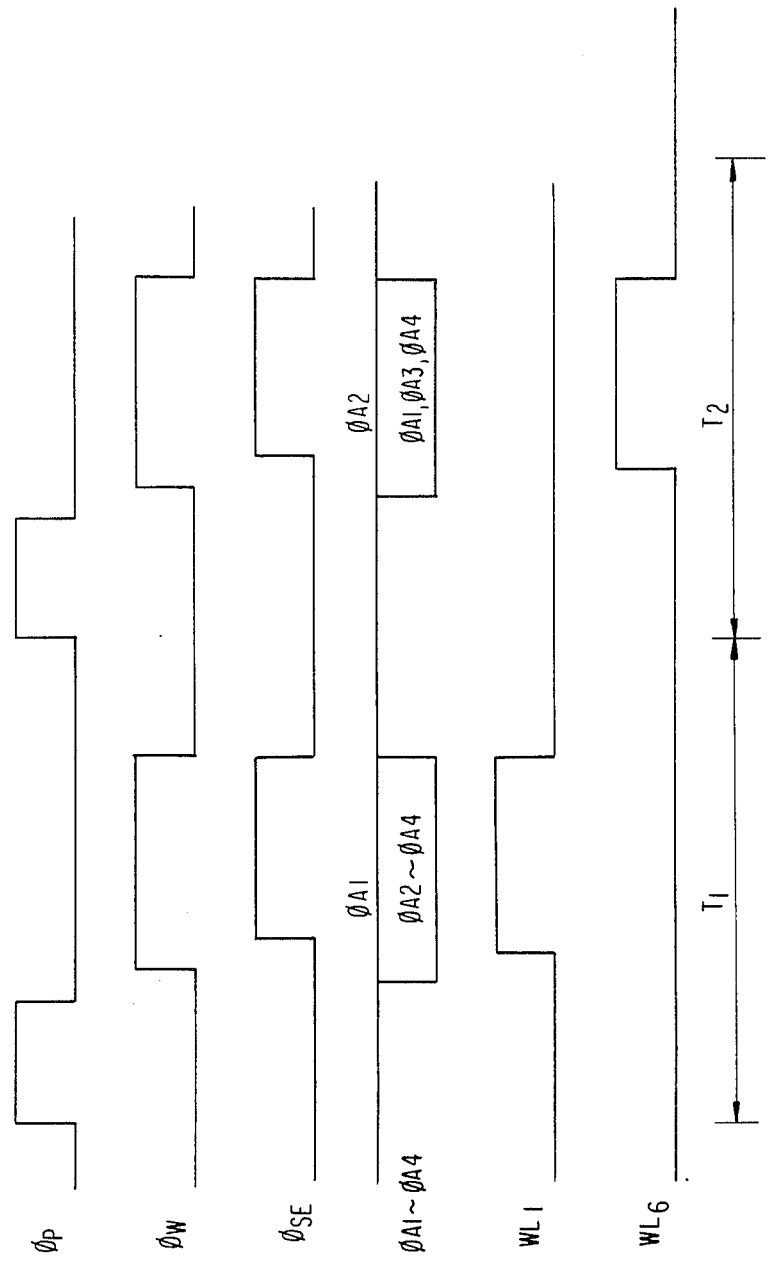

DYNAMIC MEMORY CIRCUIT WITH IMPROVED NOISE-PREVENTION CIRCUIT ARRANGEMENT FOR WORD LINES

BACKGROUND OF THE INVENTION

The present invention relates to a dynamic memory circuit composed of insulated gate field effect transistors.

A memory circuit is basically constructed of memory cells as storage units arranged at the intersections of a plurality of word lines arranged in the row direction and a plurality of bit lines (also called as digit lines) arranged in the column direction. Among the plurality of word lines, only one word line is set at a selected level and the memory cells coupled to the selected word line are enabled so as to output data to the bit lines from the enabled memory cells during a read cycle and to take the data of the bit lines into the enabled memory cells in a write or re-written cycle. In the memory circuit thus arranged, if a word line or lines other than the selected one are changed toward the selected level from the non-selected level because of noise or the like, which means that two or more word lines are erroneously selected at the same time, then, two or more memory cells associated to the same bit line are enabled and hence the contents of such enabled memory cells are simultaneously outputted to the same bit line and mixed among them. Thus, the contents of the enabled memory cells are destroyed, resulting in erroneous read or write operations. Particularly when a dynamic type decoder circuits are used to drive the word lines, the above-mentioned problem is markedly observed. Namely, outputs of such dynamic type decoder circuits are placed in a high-impedance state when they are not selected, and hence potential of non-selected word lines coupled to the non-selected decoder circuits are likely to fluctuate due to noise or the like. In more detail, the dynamic type decoder circuit is composed of a NOR gate receiving a plurality of row address signal and a transmission transistor receiving the output of the NOR gate at the gate for transmitting a driving pulse to the word line when the output of the NOR gate is true. For this reason, the non-selected word line is not connected to any of the power supplies to be put in a floating (high-impedance) condition. Consequently, the potential of the non-selected word line readily fluctuates by noise. Under such circumstance, attempts have been made to prevent the non-selected word line from floating by providing a noise prevention circuit to the respective word lines. An example of the noise prevention circuit is such arranged that the non-selected word line is clamped to a reference potential such as a ground potential by inserting a noise prevention transistor between each word line and the reference potential and allowing the noise preventing transistor to conduct during the access period of the memory. However, since the noise prevention transistor connected to the selected word line is also made conducting, the level of the selected word line more or less attenuates. This results in the following problems. Recently, the operating voltage in many such memory circuit has been reduced from 12 V to 5 V. Accordingly, the margin in the operating voltage in each circuit portion of the memory circuit is becoming smaller, making impermissible even the smallest drop in the voltage. With the memory capacity being made greater recently, each memory cell is also being minimized in size, so that the quantity of an electric charge stored therein has been reduced. On the other hand, the parasitic capacity of the bit line is being increased. It has been therefore attempted to completely transmit the electric charge accumulated in the memory cell to the bit line by raising the potential of the selected word line above the supply voltage to drive a transfer transistor of the memory cell in an unsaturated region so as to transfer a small quantity of the charge in the memory cell speedily and effectively. However, because the potential of the selected word line is reduced by the above described noise prevention circuit, the transfer transistor of the memory cell above cannot be driven in the unsaturated region.

For the above reason, an improved noise prevention circuit has been proposed which comprises a first field effect transistor coupled between an associated word line and a reference potential and having a gate connected to a precharge node, a second field effect transistor coupled between the precharge node and the reference potential and having a gate connected to the associated word line, and a third field effect transistor for operatively charging the precharge node during a period of resetting. Operation of the noise prevention circuit structured above is as follows. The precharged node is first charged by the third transistor, and the first transistor is made conductive by the charge at the precharge node when the associated word line is non-selected to keep the associated non-selected word line at the reference potential. However, such a noise prevention circuit must be added to each word line, and each of the improved noise prevention circuit necessitates three transistors. As a result, the pitch at which word lines are arranged is limited to the region where each noise prevention circuit is formed, and cannot be made smaller. This forms an obstacle to the higher integration of a memory circuit.

SUMMARY OF THE INVENTION

An object of the present invention is to provide a highly integrated dynamic memory circuit which can efficiently drive a word line.

Another object of the present invention is to provide a dynamic memory circuit which can efficiently use the charge accumulated in a memory cell and can be fabricated with a large capacity.

The memory circuit in accordance with the present invention comprises a plurality of word line groups each including a plurality of word lines, a group selection circuit provided for each of the word line groups for selecting the associated word line group, a plurality of selection transistors provided for the associated word line group and coupled between the output terminal of the associated group selection circuit and each word line of the associated word line group and a noise prevention circuit provided for each word line group and connected to the output terminal of the associated group selection circuit.

According to the present invention, since only one noise prevention circuit is provided for each word line group, the number of the noise prevention circuits necessitated can be remarkably reduced and hence an area occupied by the noise prevention circuits on a chip is made considerably smaller than what is required when such a noise prevention circuit is provided for each word line.

The noise prevention circuit effectively used in the present invention may be fabricated by a first transistor coupled between the output terminal of the group selection circuit and the reference potential terminal and having a gate connected to a precharge node, a second transistor coupled between the precharge node and the reference potential terminal and having a gate connected to the output terminal of the group selection circuit, and a third transistor for operatively charging the precharge node.

The present invention is based on the concept that the noise applied to the word line acts to reduce the potential of the word line. In other words, all of the bit lines intersecting the word lines are precharged with the power supply voltage prior to the commencement of access and electric charges of about half of the bit lines is then discharged by enabling a sense amplifier so that the precharged potential at the bit lines is reduced to the reference potential in accordance with the data of the memory cells as the access is achieved, whereas the other half of the bit lines remains to hold the precharged potential. Accordingly, the non-selected word line is affected by the discharged bit lines and the potential of the non-selected word lines is inevitably changed from the reference potential to a negative potential. When each non-selected word line is changed to the negative potential lower than the reference potential by more than the threshold level of the selection transistor, the selection transistor becomes conducting and operates to reduce the potential of the output terminal of the group selection circuit, attempting to conduct an output transistor of the non-selected group selection circuit. However, since the output terminal of the group selection circuit is equipped with the noise prevention circuit and since the potential of that output terminal is clamped to the reference potential, the output transistor of the non-selected group selection circuit would not conduct. Accordingly, the potential of each non-selected word line is effectively set close to the reference potential by the noise prevention circuit.

Therefore, the word line can be stably driven without reducing the word line driving voltage with a simple arrangement in accordance with the present invention.

BRIEF DESCRIPTION OF THE DRAWINGS

FIG. 4 is a waveform chart of the signals desired and explanatory of the operation of the circuit of FIG. 3.

DESCRIPTION OF THE PREFERRED EMBODIMENT

Figure 1:
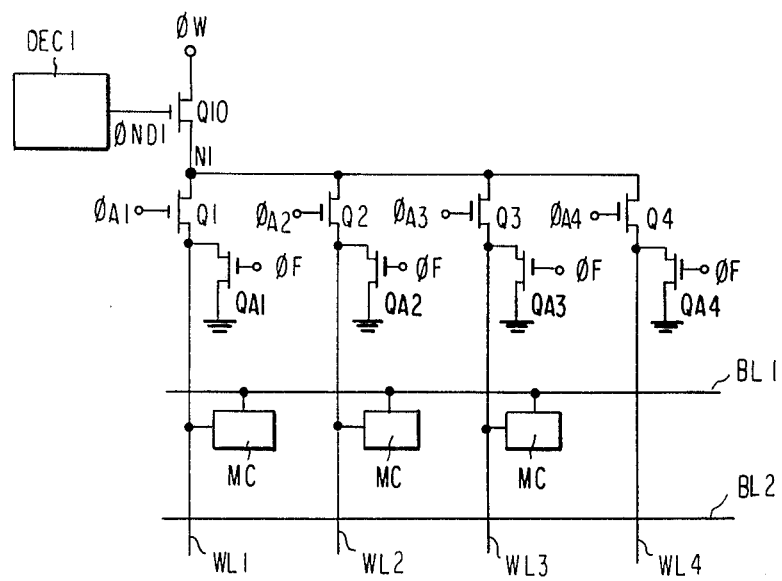
FIG. 1 is a circuit diagram illustrating the principal portion of a conventional memory circuit.

Referring now to FIG. 1, a conventional memory circuit will be described. In this example a row decoder DEC1 is used to select consecutive four word lines WL1 to WL4 and its output $\phi_{ND1}$ is connected to a drive transistor $Q_{10}$ connected between a word line driving pulse terminal $\phi w$ and a driving node $N_1$ which is coupled to the word lines WL1 to WL4 via selection transistors $Q_1$ to $Q_4$ having gates receiving sub-row selection signals $\phi_{A1}$ to $\phi_{A4}$. The subrow selection signals $\phi_{A1}$ to $\phi_{A4}$ are obtained by decoding two bits of row address signals and only one of them is allowed to have a power supply level, with others being provided with the ground potential. Consequently, the selection of the word line WL1 to WL4 is made by selecting the decoder output signal $\phi_{ND1}$ and selecting one of the sub-row selection signals $\phi_{A1}$ to $\phi_{A4}$ and then energizing the word line driving voltage $\phi w$ to the selected word line through the transistor $Q_{10}$ and one of the transistors $Q_1$ to $Q_4$. Other groups of word lines are also arranged in the same manner. Memory cells MC are arranged at the intersections of the word lines WL and bit lines BL1, BL2. Noise prevention transistors $Q_{A1}$ to $Q_{A4}$ are connected between the word lines WL1 to WL4 and the ground potential, respectively. A control signal $\phi F$ is commonly applied to the gate of each transistor to $Q_{A1}$ to $Q_{A4}$). The signal $\phi F$ is energized to make the transistors $Q_{A1}$ to $Q_{A4}$ conducting to maintain the non-selected word lines at the ground potential during a read or write operation.

The operation will be described. First, the case where the transistors $Q_{A1}$ to $Q_{A4}$ are not present is assumed for the explation. When the output signal $\phi_{ND1}$ of the decoder DEC 1 takes a non-selected level, that is, $\phi_{ND1}=$"1", the transistor $Q_{10}$ is non-conductive while the gate potential of one of the transistors $Q_1$ to $Q_4$ becomes "1", with the rest being "0". However, each of the word lines WL1 to WL4 intersects with the bit lines BL1, BL2 . . . and electrical coupling exist therebetween. On the other hand, with the amplifying operation of the sense amplifier (not shown), the half of the bit lines is made to discharge the potential. For this reason, the potential of each word line is changed towards the negative potential because of the coupling. When the negative potential thus established at the non-selected word lines exceeds the threshold level of each of the transistors $Q_1$ to $Q_4$, together with the transistor with the gate potential being "1" among the transistors $Q_1$ to $Q_4$, the remaining three transistors with the gate potential being "0" are caused to conduct because of their forward-biased gate-source voltage. Accordingly, the level at the driving node N1 is caused to be negative by the transistors $Q_1$ to $Q_4$. As a result, the transistor $Q_{10}$ also conducts even if the output signal $\phi_{ND1}$ is at "0" level and operates to electrically couple the word line driving terminal $\phi_w$ to each of the word lines WL1 to WL4. Thus the potential of the word line driving terminal $\phi_w$ is lowered. However, because of the transistors $Q_{A1}$ to $Q_{A4}$ controlled by the signal $\phi_F$, the potential of the driving node $N_1$ is prevented from changing from the ground potential to the negative potential.

Let us consider a case where the word line WL1 is selected with the selection signal $\phi_{A1}$ being at "1" level, and the signal $\phi_{ND1}$ being at "1" level. The word line WL1 is allowed to have "1" level by the word line activating terminal $\phi_w$ through the transistors $Q_{10}$ and $Q_1$. Even in this case, however, because the noise-prevention transistor $Q_{A1}$ remains conductive with the word line WL1 holding "1" level, a d.c. current path flowing through the transistor $Q_{A1}$ is caused. Consequently, even if a high float signal higher than the supply voltage is applied to the word line driving terminal $\phi_w$, the potential at the word line driving terminal $\phi_w$ would be dropped by the increased load. In the circuit of the prior art, the high float signal could not be applied to the word line driving terminal $\phi_w$ and has been limited to the supply voltage level.

Figure 2:
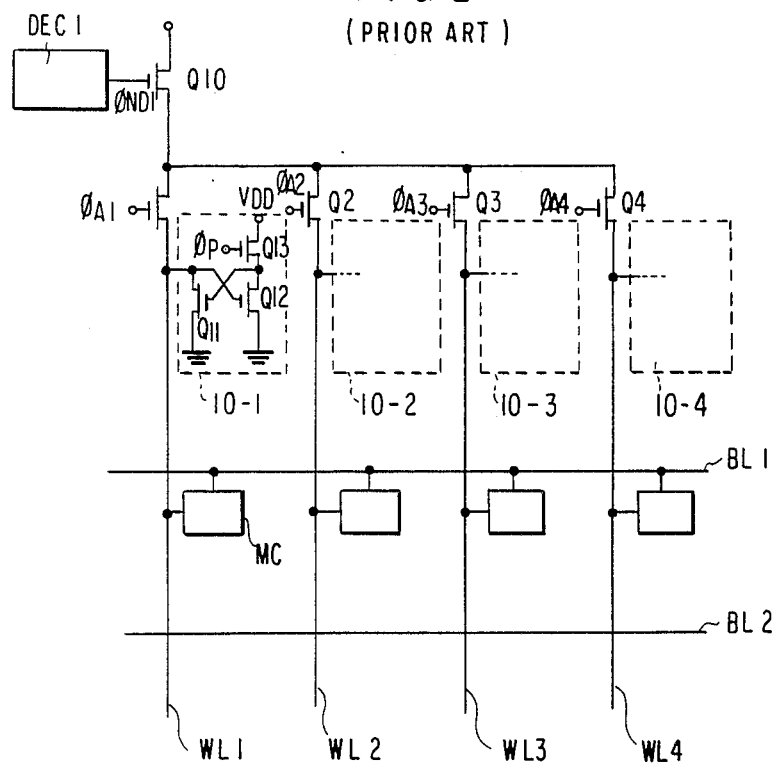
FIG. 2 is a circuit diagram illustrating the principal portion of another conventional memory circuit.

FIG. 2 shows a circuit configuration as another example of the prior art which can cause the word line to have a level higher than the supply voltage. In this circuit, a terminal of each of the flip flop circuits 10-1 to 10-4 as the noise prevention circuit is connected to each of the word lines WL1 to WL4. These flip flop circuits 10-1 to 10-4 are identical. A pair of transistors $Q_{11}$ and $Q_{12}$ form a cross-couple circuit and a drain of the transistor $Q_{11}$ is connected to the word line WL1, whereas a drain of the transistor $Q_{12}$ is connected to a gate of the transistor $Q_{12}$ and through a transistor $Q_{13}$ to a power supply terminal $V_{DD}$. A precharge signal $\phi_P$ is applied to a gate of the transistor $Q_{13}$. Now description will be made for the possibility of causing the word line driving terminal $\phi_w$ to have a level higher than the supply voltage $V_{DD}$ in the circuit of FIG. 2. When the output signal $\phi_{ND1}$ of the decoder DEC 1 and the selection signal $\phi_{A1}$ are both at "1" level, the word line WL1 is selected. At this instance, the word line WL1 becomes at "1" level because the terminal $\phi_w$ is connected thereto through the transistors $Q_{10}$ and $Q_2$. Since the gate of the transistor $Q_{12}$ in the flip flop circuit 101 is caused to have "1" level, the transistor $Q_{12}$ is turned ON and the other transistor $Q_{11}$ is turned OFF. Accordingly, no d.c. current flows through the word line WL1, allowing the word line driving terminal $\phi_w$ to be at a high float potential which is higher than the supply voltage $V_{DD}$ and the level of the word line WL1 is maintained higher than the supply voltage $V_{DD}$. When the output signal $\phi_{ND1}$ of the decoder DEC 1 is at "0" level, the transistors $Q_{11}$ and $Q_{12}$ in the flip flop circuit 101 are turned ON and OFF, respectively, so that the word line WL1 is fixed to the ground level. Thus the circuit of FIG. 2 has accomplished setting of the selected word line at a level higher than the supply voltage prior to the activation of the sense amplifier. However, this circuit necessitates a number of circuit elements and restricts reduction in spacing between the word lines to provide the flip flop circuit as the noise preventing circuit for each word line. Therefore, the disadvantage is that the memory is not allowed to have a large capacity unless the chip size is increased.

Figure 3:
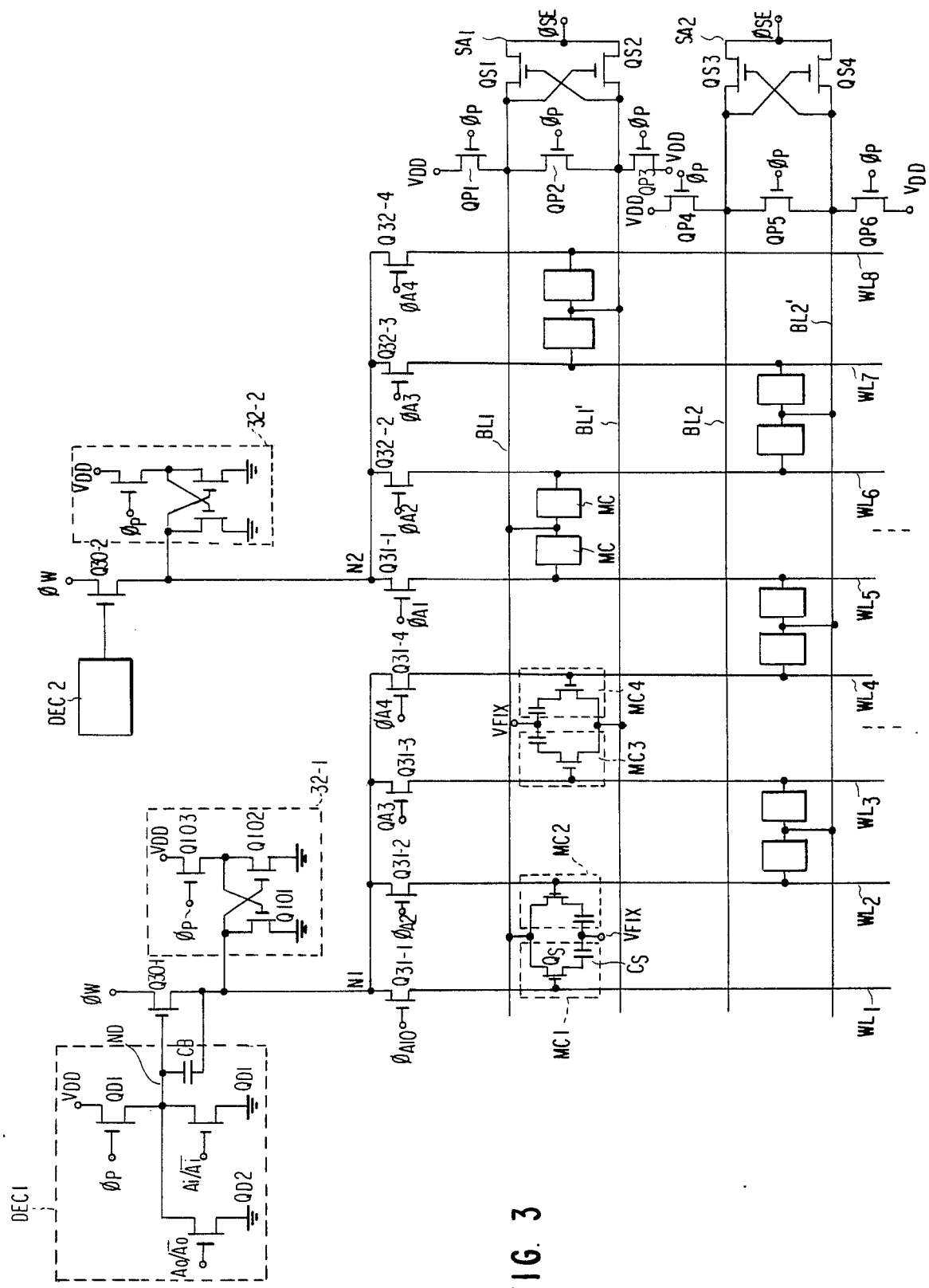
FIG. 3 is a circuit diagram illustrating a memory circuit as an exemplary embodiment of the present invention.

Referring to FIG. 3, an preferred embodiment of the present invention will be described. Each of four word lines adjacent to each other is associated to one decoder. In other words, word lines WL1 to WL4 and WL5 to WL8 are respectively addressed by decoder DEC 1 and DEC 2. The decoder DEC 1 comprises a load transistor $Q_{D1}$ connected between the power supply terminal $V_{DD}$ and a decoding node $N_D$ and receiving a precharge control signal $\phi_P$ at its gate, input transistors $Q_{D2} \ldots Q_{Di} \ldots$ to which a predetermined combination of true address input signals $A_o \ldots A_i \ldots$ and complementary address input signals $\bar{A}_o \ldots \bar{A}_i$ has been applied to form the NOR logic, and a boot-strap capacitor CB connected between the decoding node $N_D$ and the output terminal (source) of the transistor $Q_{30-1}$ driven by the node points $N_D$. Another decoder DEC 2 is constructed in the same way. The word lines WL1 to WL4 are respectively connected to a driving node $N_1$ through transistors $Q_{31-1}$ to $Q_{31-4}$ wherein selection signals $\phi_{A1}$ to $\phi_{A4}$ have been applied to the gates thereof, respectively. In the same manner, the word lines WL5 to WL8 are respectively connected to a driving node $N_2$ as the output terminal of a transistor $Q_{30-2}$ controlled by the decoder DEC 2 through transistors $Q_{32-1}$ to $Q_{32-4}$ wherein selection signals $\phi_{A1}$ to $\phi_{A4}$ have been applied to the gates thereof, respectively. Bit lines BL1, BL1', BL2, BL2' intersecting the respective word lines are provided. The bit lines BL1 and BL1' are in a complementary relation each other and connected to a pair of inputs of a sense amplifier SA1 constituted by transistors $Q_{S1}$ and $Q_{S2}$. The bit lines BL2 and BL2' are similarly connected to a pair of inputs of a sense amplifier SA2 constituted by transistors $Q_{S3}$ and $Q_{S4}$. Precharge transistors $Q_{P1}$, $Q_{P3}$, $Q_{P4}$ and $Q_{P6}$ charge the bit lines BL1, BL1', BL2 and BL2' at the power supply voltage $V_{DD}$ in response to the precharge signal $\phi_P$, respectively. Equalizer transistors $Q_{P2}$ and $Q_{P5}$ connected between the bit lines BL1 and BL1', and bit lines BL2 and BL2' are used to equally charge the respective pairs of bit lines. Two memory cells connected to the same bit line and the adjacent two word lines are adjacently arrayed and connected to the same bit line through a single contact. That is, the memory cell MC1 connected to the word line WL1 and the memory cell MC2 connected to the word line WL2 adjacent to the word line WL1 are connected to the same bit line BL1, whereas the memory cell MC3 connected to the word line WL3 and the memory cell MC4 connected to the word line WL4 adjacent to the word line WL3 are connected to the same bit line BL1'. The other memory cells connected to two word lines adjacent to each other are connected to alternately one of the pair of bit lines. By laying out the memory cells like this, the number of connections between the memory cells and bit lines can be reduced to a half and the highly integrated arrangement of memory cells can be enhanced.

In the present invention, noise prevention circuits 32-1, 32-2 . . . having a flip flop construction are connected to output node $N_1$, $N_2$ . . . of the transistors $Q_{30-1}$, $Q_{30-2}$ driven by the outputs of the decoders DEC 1, DEC 2. The noise prevention circuit 32-1 comprises a pair transistors $Q_{101}$ and $Q_{102}$ having gates and drains cross-coupled each other with sources being rounded, and a precharge transistor $Q_{103}$ connected between the drain of the transistor $Q_{102}$ and the supply terminal $V_{DD}$ having a gate supplied with the signal $\phi_P$, wherein the drain of the transistor $Q_{101}$ is connected to the node $N_1$. Other noise prevention circuits are constructed in the same way.

Subsequently referring to FIG. 4, the operation will be described.

Description is first made on a case in which the output of the decoder DEC 1 becomes "1" over a period of T1 and the signal $\phi A$ also becomes "1", so that the word line WL1 is selected.

First the precharge control signal $\phi_P$ becomes "1" and each of the bit lines BL1, BL1'... is charged nearly at the supply potential $V_{DD}$ respectively by the transistors $Q_{P1}$ to $Q_{P6}$ and the drain of the transistor $Q_{102}$ in each noise prevention circuit is charged by the transistor $Q_{103}$. Consequently, the driving nodes $N_1$ and $N_2$ are connected to the ground potential. On the other hand, the decoding node $N_D$ in each of the decoders DEC 1 and DEC 2 is charged by the transistor $Q_{D1}$. Then the boot capacitor CB is also charged. Subsequently, after the signal $\phi_P$ has changed into "0", the conditions of address input signals to the decoders are determined. After the decoding node $N_D$ of the decoder DEC 1 only becomes "1" and the other decoders become "0" and one selection signal $\phi_{A1}$ remains at "1" level while others $\phi_{A2}$ to $\phi A4$ are changed to "0" level, the potential of the word line driving terminal $\phi_w$ is raised to the supply level $V_{DD}$ or higher. Then only the driving node $N_1$ is caused to have a potential higher than the supply level and the other node points $N_2$ are left at the ground level. Since only the selection signal $\phi_{A1}$ is at "1" and other signals $\phi_{A2}$ to $\phi_{A4}$ are at "0". As a result, the word line WL1 is allowed to have a potential of the supply level $V_{DD}$ or higher through the transistors $Q_{30-1}$, $Q_{31-1}$. The transistor $Q_3$ of the memory cell MC1 is thus turned ON and the charge stored in a capacitance Cs is transmitted to the bit line BL1. Then the sense amplifier activating signal $\phi_{SE}$ changes from "1" to "0" to enable the sense amplifiers so that and the charges in ones of the respective pairs of bit lines are discharged.

In this operation, the conditions of the pair of the transistors $Q_{101}$ and $Q_{102}$ in the noise prevention circuit 32-1 are inverted and the transistor $Q_{101}$ is turned OFF, whereas the transistor $Q_{102}$ is turned ON. The noise prevention circuit 32-1 acts as only a capacitive load against the potential of the word line driving terminal $\phi_w$. On the other hand, because the word lines WL2 to WL4 have not been selected, their potentials are likely to change from the ground potential to the negative potential by the above discharging, attempting to make the level of the node $N_1$ negative. However, the capacitances of these word lines WL2 to WL4 are extremely small as compared to that in the noise prevention circuit 32-1 coupled to the node $N_1$, so that the level of the node $N_1$ is hardly lowered. As above described, it is possible to make the word line driving terminal $\phi_w$ a high float signal higher than the supply voltage $V_{DD}$ without being affected by the noise on the word lines.

Description is subsequently made on the operation of selecting the word line WL6 when the output of the decoder DEC 2 and $\phi_{A2}$ are at "1" level while the signals $\phi_{A1}$, $\phi_{A2}$ and $\phi_{A4}$ are at "0" level over a period of $T_2$. After the precharge signal $\phi_P$ becomes "1" to precharge each portion as mentioned above, $\phi_P$ becomes "0" and the output of the decoder DEC 2 becomes "1" and then the signals $\phi_{A1}$, $\phi_{A3}$ and $\phi_{A4}$ other than $\phi_{A2}$ are turned to "0". Following a rise in the potential of the terminal $\phi_w$, the word line WL6 is selected. Then the sense amplifier activating signal $\phi$SE becomes "0", causing the half of the charges of the digit lines to be discharged. For this reason, the word lines WL1 to WL4 would change from the ground to negative levels because of the coupling of the parasitic capacity with the bit lines and the transistors $Q_{31-1}$ to $Q_{31-4}$ are turned ON. Therefore, the level at the node $N_1$ would be made negative. However, in the noise prevention circuit 32-1, the transistor $Q_{101}$ is kept ON by the precharge and the node $N_1$ are maintained at the ground potential. Accordingly, the node point $N_1$ is held at the ground potential. As a result, the transistor $Q_{30-1}$ is not allowed to be turned ON. In addition, the word lines WL1 to WL4 are also maintained at the ground potential, causing no problem.

As above described, a memory circuit which is simple in construction and stable in operation can be realized according to the present invention. The present invention is not limited to the above described embodiment but applicable to any memory circuits with address or matrix arrangements.

I claim:

1. A memory circuit comprising a plurality of word line groups each including a plurality of word lines, a plurality of bit lines intersecting with said word lines, a plurality of memory cells arrayed at the intersections of said word lines and said bit lines, a group selection circuit provided for each of said word line groups, a set of connection circuits provided for each of said word line groups, each of said connection circuits being coupled between an output terminal of the associated group selection circuit and associated one of word lines in the associated word line group, means for selecting one of said connection circuits in each set, and a noise prevention circuit provided for each of said word line groups, said noise prevention circuit being coupled to the output terminal of the associated group selection circuit and maintain said output terminal at a reference potential when said associated group selection circuit is not enabled, each of said noise prevention circuits including a first field effect transistor coupled between a first node and a reference potential terminal and having a gate connected to a second node, a second field effect transistor coupled between said second node and said reference potential terminal and having a gate connected to said first node, a third field effect transistor coupled between said second node and a power voltage terminal, and means for connecting said first node to the output terminal of the associated group selection circuit.

2. A memory circuit comprising a plurality of word line groups each including a plurality of word lines, a plurality of bit lines intersecting with said word lines, a plurality of memory cells arrayed at the intersections of said word lines and said bit lines, a group selection circuit provided for each of said word line groups, a set of connection circuits provided for each of said word line groups, each of said connection circuits being coupled between an output terminal of the associated group selection circuit and associated one of word lines in the associated word line group, means for selecting one of said connection circuits in each set, and a noise prevention circuit provided for each of said word line groups, said noise prevention circuit being coupled to the output terminal of the associated group selection circuit and maintaining said output terminal at a reference potential when said associated group selection circuit is not enabled, each of said group selection circuits including an NOR gate receiving a plurality of address input signals, a drive transistor coupled between a drive voltage terminal and the output terminal of the selection circuit itself, and means for connecting a gate of said drive transistor to an output circuit of said NOR gate.

3. A memory circuit comprising a plurality of word line groups each including a plurality of word lines, a plurality of bit lines intersecting with said word lines, a plurality of memory cells arrayed at the intersections of said word lines and said bit lines, a plurality of group selection circuits provided for each of said word line groups and having an output terminal, a plurality of sets of connection circuits, a set of said connection circuits being provided for each of said word line groups, each of said connection circuits being coupled between the output of the associated group selection circuit and each word line in the associated word line group, means for selecting one of said connection circuits in each set thereof, and a plurality of noise prevention circuits provided for each of said group selection circuits, each of said noise prevention circuits being directly connected to the output terminal of the associated group selection circuit and providing a current path between the output terminal of said associated group selection circuit and a reference voltage when the output terminal of said associated group selection circuit is of a non-selection level and electrically separating the output terminal of said associated group selection circuit from said reference voltage source when the output terminal of said associated group selection circuit is of a selection level.

4. The memory circuit according to claim 2, in which each of said set of connection circuits includes a transfer field effect transistor coupled between the output terminal of the associated group selection circuit and associated one of word lines in the associated word line group.

5. A memory circuit comprising a plurality of word lines arranged in parallel, said plurality of word lines being divided into a plurality of word line groups each including a plurality of word lines, a plurality of bit lines intersecting with said word lines, a plurality of memory cells, a plurality of group selection circuits each provided for each of said word line groups, a plurality of selection circuits, each of said selection circuits being coupled to associated one of said group selection circuits and associated one of said word line groups, each of said selection circuit selecting one of word lines of the associated word line group when an output of the associated group selection circuit is selected, and a plurality of flip flop circuits, each of said flip flop circuits being connected to the output of the associated group selection circuit, each of said flip flop circuits including a first field effect transistor coupled between a first node and a reference voltage terminal and having a gate connected to a second node, a second field effect transistor coupled between said second node and said reference voltage terminal and having a gate connected to said first node, and means for connecting said first node to the output of the associated group selection signal.

6. The memory circuit according to claim 5, in which each of selection circuits includes a plurality of control terminal of the same number as that of the word lines of said word line group, and a plurality of selection field effect transistors each having a gate coupled to associated one of said control terminals and coupled between the output of the associated group selection circuit and associated one of the word lines of the associated word line group.

7. The memory circuit according to claim 5, in which said memory cells are arranged in such a manner that every two memory cells connected to adjacent two word lines are connected to the same bit line.

8. The memory circuit according to claim 5, in which each of said group selection circuit includes a decoder circuit receiving a plurality of address input signals and a drive transistor coupled between a word line drive voltage terminal and the output terminal of the selection circuit itself and having a gate coupled to an output of said decoder.

9. The memory circuit according to claim 3, in which each of said nose prevention circuits includes a first field effect transistor coupled between a first node and a reference potential terminal and having a gate connected to a second node, a second field effect transistor coupled between said second node and said reference potential terminal and having a gate connected to said first node, a third field effect transistor coupled between said second node and a power voltage terminal, and means for connecting said first node to the output terminal of the associated group selection circuit.

10. The memory circuit according to claim 3, in which each of said group selection circuits includes an NOR gate receiving a plurality of address input signals, a drive transistor coupled between a drive voltage terminal and the output terminal of the selection circuit itself, and means for connecting a gate of said drive transistor to an output circuit of said NOR gate.

11. The memory circuit according to claim 3, in which each of said set of connection circuits includes a transfer field effect transistor coupled between the output terminal of the associated group selection circuit and associated one of word lines in the associated word line group.

* * * * *

UNITED STATES PATENT AND TRADEMARK OFFICE
CERTIFICATE OF CORRECTION

PATENT NO. : 4,610,002

DATED : September 2, 1986

INVENTOR(S) : Shouji Kaneko

It is certified that error appears in the above-identified patent and that said Letters Patent is hereby corrected as shown below:

Column 4, line 32, after "transistor" delete "to" and insert --(--.
Column 7, line 35, delete "$\emptyset A4$" and insert --$\emptyset_{A4}$--.

Signed and Sealed this

Seventh Day of April, 1987

Attest:

DONALD J. QUIGG

*Attesting Officer*   *Commissioner of Patents and Trademarks*